United States Patent [19]

Perkins

[11] Patent Number: 4,663,594

[45] Date of Patent: May 5, 1987

[54] ELECTRONIC PHASE SHIFTER CIRCUIT AND METHOD

[75] Inventor: Geoffrey W. Perkins, Chandler, Ariz.

[73] Assignee: Motorola, Inc., Schaumburg, Ill.

[21] Appl. No.: 650,026

[22] Filed: Sep. 13, 1984

[51] Int. Cl.[4] .......................... H03K 5/00; H03K 1/12
[52] U.S. Cl. .................................. 328/155; 307/262; 307/511; 330/261
[58] Field of Search ....................... 307/511, 512, 262; 328/155, 133; 330/261, 252; 332/16 R, 16 T, 23 A, 24; 329/131

[56] References Cited

U.S. PATENT DOCUMENTS

| | | | |
|---|---|---|---|
| 3,852,624 | 12/1974 | Marik et al. | 307/262 |
| 3,961,360 | 6/1976 | Sato et al. | 328/133 |
| 4,052,679 | 10/1977 | Hosoya | 328/155 |
| 4,058,771 | 11/1977 | Ohsawa et al. | 455/333 |
| 4,480,337 | 10/1984 | Graziadei et al. | 455/333 |

FOREIGN PATENT DOCUMENTS 0152790 8/1984 Japan ................................. 307/511

*Primary Examiner*—Stanley D. Miller
*Assistant Examiner*—Timothy P. Callahan
*Attorney, Agent, or Firm*—Michael D. Bingham

[57] ABSTRACT

A double balanced modulator is combined with a circuit for providing a quadrature current signal and a current steering circuit to produce a substantially constant amplitude output signal having a phase that is continuously shifted over a range of 180 degrees in response to a dc control voltage signal being varied from a maximum value to a minimum value. The balanced modulator includes an input differential amplifier circuit coupled with a mixer circuit portion thereof with the mixture circuit portion receiving a first alternating signal at the inputs thereof. The circuit for providing the quadrature current signal is coupled between the outputs of the mixer circuit portion and a circuit node of the differential amplifier circuit of the balanced modulator and receives a second alternating signal that is in quadrature phase relationship to the first alternating signal. A quadrature current signal is produced and summed at the outputs of the mixer circuit portion with the output current signal produced at the output of the balanced modulator. The current steering control circuitry is coupled with both inputs of the differential amplifier means and the circuit for providing the quadrature current signal to control the biasing thereof such that in response to the magnitude of the dc control voltage signal being varied from a maximum value to a minimum value the magnitude of the quadrature current signal is varied inversely with respect to the magnitude of the output signal produced from the output of the balance modulator to produce the constant amplitude output signal of the phase shifter.

7 Claims, 1 Drawing Figure

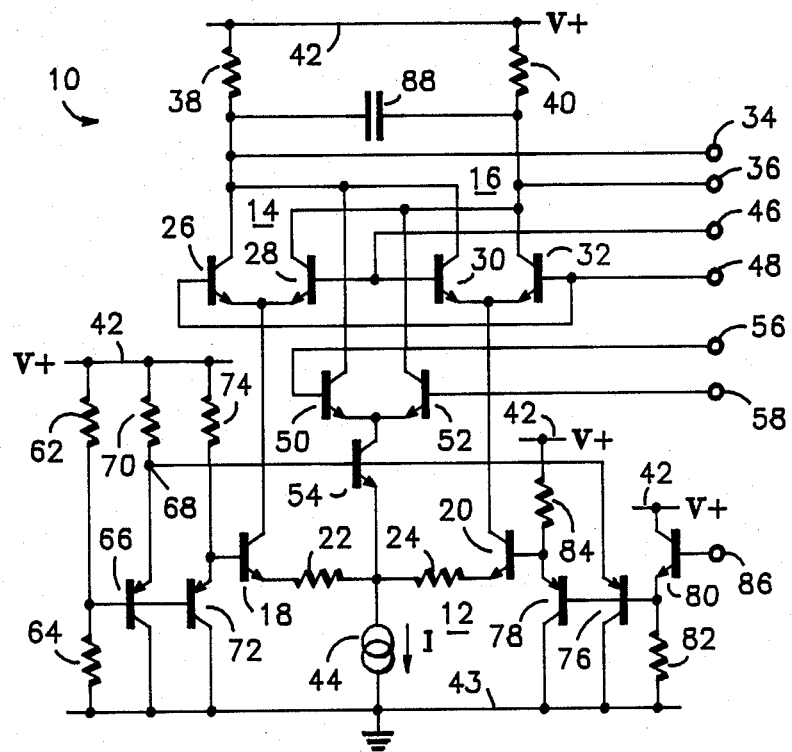

ELECTRONIC PHASE SHIFTER CIRCUIT AND METHOD

BACKGROUND OF THE INVENTION

The present invention relates to phase shifting circuits for varying the phase of a signal appearing at the output of a circuit and, more particularly, to an electronic phase shifter circuit for producing an output voltage signal the phase of which can be varied continuously over a wide range while maintaining a substantially constant output amplitude.

There is a need for a rather simple and inexpensive circuit for producing a substantially constant output signal the phase of which can be continuously varied over a wide range. Many prior art phase shifting circuits can vary the phase of the outputs thereof over a ninety degree range. However, very few, if any phase shifter circuits are found that are capable of shifting the phase of the output signal derived therefrom over one hundred eighty degrees of range while maintaining the output magnitude of the signal at a constant level. Furthermore, it is not known of any prior art circuit that can provide a constant output level signal the phase of which can be varied one hundred eighty degrees which is derived from a pair of quadrature phase related alternating input signals.

SUMMARY OF THE INVENTION

Accordingly, it is an object of the present invention to provide an improved phase shifter circuit.

It is another object of the present invention to provide a method for generating a substantially constant level output signal having a phase which can be continuously varied over a wide range.

Still another object of the present invention is to provide a phase shifter circuit for producing an output signal the phase of which can be varied continuously over a wide range while maintaining the level thereof substantially constant.

Yet another object of the present invention is to provide a phase shifter circuit for producing a substantially constant output level signal the phase of which can be varied continuously over a wide range utilizing a pair of alternating input signals which are in phase quadrature relationship.

In accordance with the above and other objects there is provided a phase shifter for producing an output signal having a substantially constant amplitude and a phase which can be varied continuously over a one hundred eighty degree range which comprises a balanced modulator circuit and additional circuitry operatively coupled with the balanced modulator circuit. The balanced modulator circuit and the additional circuitry receive first and second alternating input signals respectively that are in quadrature phase with respect to each other with the outputs thereof being summed together to produce an output signal from the phase shifter the phase of which is varied over one hundred eighty degrees in response to a direct current control signal being applied to a current steering circuit DC being varied from a maximum to a minimum value.

BRIEF DESCRIPTION OF THE DRAWING

The single FIGURE illustrates in schematic diagram form the phase shifter circuit of the preferred embodiment.

DETAILED DESCRIPTION OF THE PREFERRED EMBODIMENT

Turning to the sole Figure, there is shown phase shifter circuit 10 of the preferred embodiment. Phase shifter circuit 10 is suited to be manufactured in monolithic integrated circuit form using conventional integrated circuit processes. Phase shifter circuit 10 utilizes a conventional double balanced modulator in combination with current steering control circuitry as will be explained. As illustrated, the balanced modulator circuit portion of phase shifter circuit 10 of the preferred embodiment comprises a differential amplifier input section 12 that is interconnected to a multiplier section including differential amplifier sections 14 and 16. Differential amplifier section 12 includes a pair of differentially connected NPN transistors 18 and 20 of which the first electrodes are emitters thereof are coupled together through degenerative resistors 22 and 24. Differential amplifier section 14 of the multiplier circuit portion of the balanced modulator includes NPN transistors 26 and 28 the emitters of which are connected to the collector of second electrode of transistor 20. Similarly, differential amplifier 16 of the multiplier portion of the balanced modulator includes NPN transistors 30 and 32 the emitters of which are connected to the collector of transistor 20. The collectors of the transistors 26 and 30 are interconnected and coupled to a first output 34 of phase shifter circuit 10. Similarly, The interconnected collectors of transistors 28 and 32 are coupled to a second output 36 of phase shifter circuit 10. Resistive loads are provided through resistors 38 and 40 which are coupled between power supply conductor 42 to the respective outputs 34 and 36. A constant current source 44 is provided that is coupled between power supply conductor 43 and the circuit node between interconnected resistors 22 and 24. Current source 44 sources a constant current, I, from the circuit node. Because only a single current source is utilized, the mean direct current (dc) level at outputs 34 and 36 is maintained constant as the phase of the output signal developed there across is shifted. The base or control electrodes of transistors 26, 32 and 28, 30 are interconnected and coupled respectfully to terminals 46 and 48 at which is supplied a first square wave or alternating signal.

A current producing circuit comprising NPN transistors 50, 52 and 54 is provided which, as will be explained later, introduces a quadrature current signal that is mixed or summed with the output signal produced at the output of differential amplifiers 14 and 16. Differentially connected transistors 50 and 52 have their commonly connected emitters coupled to the collector of transistor 54. The collectors of transistors 50 and 52 are connected respectfully to outputs of the multiplier section of the double balanced modulator to outputs 34 and 36 of phase shifter circuit 10. A second applied alternating signal, which is in quadrature phase relationship to the first alternating signal, is applied at inputs 56 and 58 to the respective base electrodes of transistors 50 and 52. For instance, the first and second applied alternating signals may be digital control signals derived from a ring counter circuit. As will be explained, a current signal is steered through transistor 54, which has its emitter and base connected respectively to the circuit node between resistors 22 and 24 and circuit node 68, to the emitters of transistors 50 and 52 to generate the aforementioned quadrature current signal.

A current steering circuit is utilized to steer the current through transistors 18, 20 and 54 in response to a dc voltage control signal applied thereto. This current steering circuit includes a resistive divider circuit comprising resistors 62 and 64 coupled between power supply conductors 42 and 43 which produces a substantially constant voltage at the interconnection of the two resistors. This constant voltage is applied to the base electrodes of PNP transistor 66 and 72. Transistor 66, having its collector and emitter coupled respectfully to power supply conductor 43 and circuit node 68 and to power supply conductor 42 via resistor 70, establishes a voltage potential at the base of transistor 54. Similarly, a bias potential is supplied to the input of differential amplifier 12 at the base of transistor 80 which is connected to the emitter of transistor 72 and via resistor 74 to power supply conductor 42. The collector of transistor 72 is coupled to power supply conductor 43. The base of transistor 54 is also connected to the emitter of PNP transistor 76 whose base is connected in common with the base of PNP transistor 78 to the emitter of NPN transistor 80. The collector-emitter path of transistor 80 is coupled between power supply conductor 42 and power supply 43 via emitter resistor 82. The aforementioned dc control voltage signal is applied to the current steering circuit at the base of transistor 80 which is connected to terminal 86. The emitter of transistor 78 is connected to the second input of differential amplifier 12 to the base of transistor 20 and through a resistor 84 to power supply conductor 42. Transistor 78 has its collector connected to power supply conductor 43.

The operation of the balanced modulator circuit portion of phase shifter circuit 10 is well understood by those skilled in the art. It is therefore only briefly described hereinafter. Generally, in response to the magnitude of the dc control voltage signal supplied at terminal 86 being varied from a maximum value to a minimum value, transistor 18 is rendered more and more conductive while transistor 20 is rendered less and less conductive. When the magnitude of the dc control voltage signal reaches a mid value, transistors 18 and 20 will be conducting equally wherein the respective collector currents therefrom are equal. When the collector currents of transistors 18 and 20 are equal, the double balanced modulator is in an balanced operating state. Due to the multiplier action of interconnected transistors 26, 28, 30, and 32 the differential output signal appearing at outputs 34 and 36 goes to a zero or some minimum value at the aforementioned balanced operating state. The differential output signal however is at a maximum value when either transistor 18 or 20 is fully conducting while the other transistor is turned off. Thus, the output signal produced at the output of the multiplier section of the double balanced multiplier comprising transistors 26, 28, 30, and 32 will vary from some maximum value to a minimum value and then back to a maximum value as the dc control voltage signal decreases from a maximum value to a mid value level and then to a minimum value. However, at the balanced operating state, the phase of this output signal is discontinuously switched by one hundred eighty degrees. Therefore, as the dc control voltage signal is varied from its maximum value to its minimum value, the phase of the output signal produced at the output of the multiplier section of the double balanced modulator switches 180 degrees with the output signal varying from a maximum to a minimum and then to a maximum value.

Simultaneously, a current is steered through the quadrature signal producing circuit via transistors 54, 50 and 52 to produce a current signal that appears at the outputs of the multiplier section of the double balanced modulator the magnitude of which varies inversely with the magnitude of the output signal that is derived at the output of the multiplier section. The phase of this current signal derived at the collectors of transistors 50 and 52 is always in quadrature relationship to the output signal produced through the multiplier section itself. This quadrature current signal is then mixed or summed with the output signal produced by the double balanced modulator at the output of the multiplier section thereof to produce a differential signal across outputs 34 and 36 the amplitude of which will remain substantially constant as the phase thereof is varied continuously over a one hundred eighty degree range. Hence, as the dc control voltage signal is varied from a maximum value to a minimum value the magnitude of the quadrature current signal varies from a minimum value to a maximum and then to a minimum value with the maximum value thereof occurring at the balanced operating state of transistors 18 and 20. By summing the output signal produced through the multiplier section of the double balanced modulator with the output quadrature current signal produced from transistors 50 and 52, the output signal appearing at outputs 34 and 36 is as described above.

Referring again to the Figure, the above described operation is more fully explained. Thus, at balance, the magnitude of the dc control voltage signal will be at some predetermined mid-value. A potential is applied at the base of transistor 20 that is equal to the potential applied to the base of transistor 18 such that the collector currents flowing through these two transistors are equal. The voltage potential developed at the base of transistor 18 is made equal to the value of the voltage drop across resistor 64 plus the base-emitter voltage drop of transistor 72. Transistors 66 and 72, being matched devices, produce respectively voltage potentials at node 68 and at the base of transistor 18 which are equal. Hence, at the balance operating state of the modulator, the voltage potentials appearing at the base electrodes of transistors 18, 20 and 54 are substantially equal in magnitude. Since transistor 54 has no degenerative resistor in the emitter path thereof it will "steal" substantially all the current from transistors 18 and 20 sourced by current source 44 and therefore reduce the collector currents flowing through these two transistors to a minimum value which insures that essentially no output signal appears at the output of the multiplier section to outputs 34 and 36 of phase shifter circuit 10. However, substantially all the current sourced through current source 44 is steered through transistor 54 to produce a differential signal across outputs 34 and 36 that is in quadrature phase relation to any output signal produced through differential amplifiers 14 and 16. This quadrature phase related output signal is at a maximum value when the dc control voltage signal is at its mid-value as explained above. As the magnitude of the dc control voltage signal is increased from its mid-value potential transistor 54 will start turning off while transistor 20 begins to conduct more and more; transistor 18 also beginning to conduct less and less. Transistor 54 is eventually turned off because the voltage applied to the base thereof is held constant by the potential appearing at node 68 while the base voltage at transistor 20 is increasing. Similarly, as the dc control voltage signal is decreased from the mid-value potential, transistor 20 is rendered less and less conductive until it turns off. Simultaneously with transistor 20 being turned off, a point is reached where the voltage at node 68 cannot be maintained constant by transistor 66 due to transistor 76 becoming more conductive which sources more and more current through resistor 70. As the voltage level at node 68 decreases as transistor 76 becoming more conductive transistor 54 conducts less and less which reduces the magnitude of the quadrature current signal derived at outputs 34 and 36 through transistors 50 and 52. However, as transistor 54 becomes less conductive transistor 18 becomes more conductive.

Therefore, as described above, the magnitude of the quadrature phase signal, derived through transistor 54 and the differential amplifier comprising transistors 50 and 52 is at a maximum value at the balance operating state of phase shifter circuit 10. As phase shifter circuit 10 is operated further and further away from the balanced operating state the magnitude of the quadrature current becomes less and less while the current signal appearing the output of the multiplier section increases. The phase of the current introduced through transistors 18 or 20 is always in phase quadrature relationship to the current signal produced at the output of transistors 50 and 52. However, the currents introduced through transistors 18 and 20 are also one hundred eighty degrees out of phase with respect to each other. Thus, as the operation of phase shifter circuit 10 is varied from one extreme operating state through balance to the other extreme operating state the relative phase of the output signal varies from zero-to-one hundred eighty degrees while the amplitude of the output signal remains constant. In order to smooth the output wave form appearing at outputs 34 and 36 during transition through ninety degrees, capacitor 86 is utilized.

Hence, what has been described above, is a novel phase shifter circuit for providing a substantially constant amplitude output signal having a phase which can be varied over 180 degrees of range. The degree of phase shift is controlled by varying a dc control voltage signal which is supplied to the phase shifter circuit. The phase shifter circuit comprises a conventional double balanced modulator/multiplier circuit in combination with a dc voltage controlled current steering circuit and a quadrature current producing circuit that introduces a current signal at the output of the phase shifter circuit that is in phase quadrature to the current output signal derived at the output of the balanced modulator. The magnitude of the phase quadrature current signal is inversely related to the magnitude of the output signal of the balanced modulator circuit such that by summing the two signals at the output of the double balance modulator, the output signal appearing at the output of the phase shift circuit has an amplitude that remains constant while the phase is varied over a 180 degree range.

I claim:

1. A phase shifter for producing a continuous output signal having substantially constant amplitude the phase of which is varied over an 180 degree range in response to a dc control signal applied thereto, comprising:
   a balanced modulator including first, second and third differential amplifiers each having a pair of inputs, a pair of outputs and a common terminal, said outputs of said first differential amplifier being coupled respectively to said common terminals of said second and third differential amplifiers and said common terminal of said first differential amplifier being coupled to a substantially constant current source, a first one of each pair of outputs of said second and third differential amplifiers being coupled to a first output of the phase shifter and a second one of each pair of outputs of said second differential amplifier being coupled to a second output of the phase shifter, a first and a second input of said pair of inputs of said second differential amplifier being coupled respectively to a second and a first input of said third differential amplifier and receiving a first alternating signal supplied thereto, said balanced modulator producing an output signal the phase of which switches discontinuously by 180 degrees as the amplitude thereof decreasesfrom a maximum value to a minimum value and then to a maximum value as the dc control signal is varied from a maximum to a minimum value;
   circuit means coupled between said common terminal of said first differential amplifier and said first and second outputs of the phase shifter and having a pair of inputs to which is supplied a second alternating input signal which is in phase quadrature to said first alternating signal for producing an output signal that is in phase quadrature to said output signal produced by said balanced modulator and having an amplitude that varies inversely with respect to said output signal of said balanced modulator; and
   control circuit means responsive to said dc control signal being varied for varying the bias of said first differential amplifier and said circuit means to produce the output signal at said first and second outputs of the phase shifter accordingly, said control circuit means having an input to which said dc control signal is applied and a pair of outputs coupled respectively to said pair of inputs of said first differential amplifier.

2. The phase shifter of claim 1 wherein said circuit means includes:
   a first pair of transistors each having first, second and control electrodes, said first electrodes thereof being coupled together, said control electrodes being coupled to said pair of inputs to receive said second alternating signal, said second electrode of a first one of said pair of transistors being coupled to said first output of the phase shifter and said second electrode of a second one of said pair of transistors being coupled to said second output of the phase shifter, the output signal of the phase shifter appearing across said first and second outputs; and
   a first transistor having first, second and control electrodes, said first electrode being coupled to said common terminal of said first differential amplifier, said second electrode being coupled to said first electrodes of said first pair of transistors, said control electrode being coupled at a first circuit mode of said current control circuit means at which is provided a bias potential.

3. The phase shifter of claim 2 wherein said control circuit means includes:
   first transistor circuit means for providing a substantially constant dc potential at an output thereof which is supplied to said first input of said first differential amplifier and providing said bias potential at a second output to said first circuit node: and second transistor circuit means receiving said dc control signal at an input for providing a dc potential at first and second outputs thereof the value of which varies proportional with said dc control signal, said first output being coupled to said second input of said first differential amplifier, said second output being coupled to said first circuit node.

4. The phase shifter of claim 3 wherein said first transistor circuit means includes:

a resistor divider circuit coupled between first and second power supply conductor means;

a first transistor having first, second and control electrodes, said first electrode being coupled to said first circuit node, said second electrode being coupled to said second power supply conductor means, and said control electrode being coupled to said resistor divider circuit; and a first resistor coupled between said first power supply conductor means and said first circuit node.

5. The phase shifter of claim 4 wherein said second transistor circuit means includes a first transistor having a first, second and control electrodes, said first electrode being coupled both to said first power supply conductor means and to said second input of said first differential amplifier, said second electrode being coupled to said second power supply conductor means; and a second transistor having first, second and control electrodes, said first electrode being coupled to said second power supply conductor means and said control electrode of said first transistor of said second transistor circuit means, said second electrode being coupled to said first power supply conductor means and said control electrode being coupled to said input of said control circuit means.

6. The phase shifter of claim 5 wherein said second transistor circuit means includes a third transistor having first, second and control electrodes, said first electrode being coupled to said first circuit node, said second electrode being coupled to said second power supply conductor means, and said control electrode being coupled to said first electrode of said second transistor of said second transistor circuit means.

7. The phase shifter of claim 5 including resistive load means coupled between said first power supply conductor means and said first and second outputs of the phase shifter.

* * * * *

UNITED STATES PATENT AND TRADEMARK OFFICE
CERTIFICATE OF CORRECTION

PATENT NO. : 4,663,594
DATED : May 5, 1987
INVENTOR(S) : Geoffrey W. Perkins

It is certified that error appears in the above-identified patent and that said Letters Patent is hereby corrected as shown below:

Column 6, claim 1, line 18, please delete "decreasesfrom" and insert therefor --decreases from--.

Column 6, claim 2, line 62, please delete "mode" and insert therefor --node--.

Column 7, claim 5, lines 23 and 24 after "having" please delete --a--.

Signed and Sealed this

Fifth Day of December, 1989

Attest:

JEFFREY M. SAMUELS

Attesting Officer    Acting Commissioner of Patents and Trademarks